United States Patent
Kim (10) Patent No.: US 6,933,161 B2
(45) Date of Patent: Aug. 23, 2005

(54) METHOD OF FORMING AN IMAGE SENSOR WITH LARGE RADIUS MICRO-LENSES

(75) Inventor: Sang-sik Kim, Suwon (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/460,573

(22) Filed: Jun. 12, 2003

(65) Prior Publication Data
US 2005/0142689 A1 Jun. 30, 2005

Related U.S. Application Data

(62) Division of application No. 09/915,094, filed on Jul. 25, 2001, now Pat. No. 6,605,851.

(30) Foreign Application Priority Data

Nov. 13, 2000 (KR) .............................. 2000-67107

(51) Int. Cl.$^7$ ............................................. H01L 21/00
(52) U.S. Cl. ........................... 438/27; 438/29; 438/31; 438/64; 438/65; 438/70
(58) Field of Search ............................ 438/31, 29, 27, 438/64, 65, 70; 257/294, 443, 291, 619, 432, 257/436

(56) References Cited

U.S. PATENT DOCUMENTS

| | | | | |
|---|---|---|---|---|
| 5,321,249 A | * | 6/1994 | Nomura | 250/208.1 |
| 5,694,246 A | * | 12/1997 | Aoyama et al. | 359/619 |
| 5,734,190 A | * | 3/1998 | Hawkins et al. | 257/432 |
| 5,990,506 A | * | 11/1999 | Fossum et al. | 257/294 |
| 6,414,343 B1 | * | 7/2002 | Kondo et al. | 257/294 |
| 6,452,154 B1 | * | 9/2002 | Assadi et al. | 250/216 |
| 6,577,342 B1 | * | 6/2003 | Wester | 348/340 |
| 6,861,280 B2 | * | 3/2005 | Yamamoto | 438/70 |

FOREIGN PATENT DOCUMENTS

JP 60262458 12/1985 ........... H01L 27/14

* cited by examiner

*Primary Examiner*—W. David Coleman
*Assistant Examiner*—Khiem Nguyen
(74) *Attorney, Agent, or Firm*—Mills & Onello LLP (57) ABSTRACT

A solid state image sensor having micro-lenses connected to each other by filling separations between trapezoidal separated sections of a protection layer with photoresist and a manufacturing method thereof comprises trapezoidal separated sections of the protection layer which is formed on a predetermined lower layer of a semiconductor substrate and convex micro-lenses having a predetermined radius of curvature that are connected to each other by filling the separations between the separated sections of the protection layer with photoresist.

17 Claims, 5 Drawing Sheets

METHOD OF FORMING AN IMAGE SENSOR WITH LARGE RADIUS MICRO-LENSES

RELATED APPLICATIONS

This application is a divisional application of U.S. Ser. No. 09/915,094, filed Jul. 25, 2001, now U.S. Pat. No. 6,605,851, the content of which is incorporated herein by reference.

BACKGROUND OF THE INVENTION

1. Field of the Invention

The present invention relates to a semiconductor device and a method of manufacturing the same, and more particularly, to a solid state image sensor and a method of manufacturing the same.

2. Description of the Related Art

Solid state image sensors are used in a variety of applications in disciplines such as public security, industry, broadcasting, and the military. For example, solid state image sensors are used in various devices such as cameras, camcorders, multimedia devices, and surveillance cameras. Particularly, as miniaturization and the number of pixels of solid state image sensors increase, the demand for efficient manufacture of low-cost solid state image sensors, especially those that include on-chip micro-lenses, also increases.

Sensitivity and manufacturing yield are very important details to consider when manufacturing a solid state image sensor. Therefore, micro-lenses are formed on the upper portion of a sensor to improve sensitivity. A light ray incident on the solid state image sensor passes through the micro-lens, which is installed for improving the light collection efficiency, and the light energy is collected by a photodiode. The light energy collected by the photodiode is converted into a signal charge, and the signal charge is transmitted to an output terminal by a transmission device such as a vertical transmission charge-coupled device (CCD) or a horizontal transmission CCD. The signal charge transmitted to the output terminal is output as an electrical signal corresponding to the amount of energy imparted by the incident photons.

Figure 1:
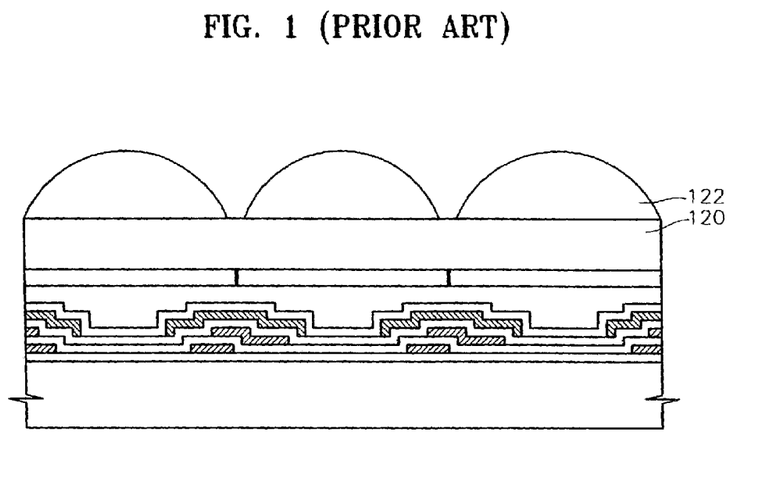
FIG. 1 is a sectional view illustrating a solid state image sensor including general micro-lenses.

FIG. 1 is a sectional view illustrating a solid state image sensor including conventional micro-lenses.

Referring to FIG. 1, micro-lenses 122 are formed on a flat protection layer 120. The micro-lenses 122 are generally formed of an organic substance including photoresist. Photoresist patterns are formed, and are then heat treated and flowed, thereby forming convex lenses having a proper radius of curvature. However, if the photoresist patterns are formed by a thermal flow in two-dimensions on a flat protection layer 120, the radius of curvature of the respective micro-lenses 122 can vary, due to variations in local surface energy over a large area. Also, when forming the micro-lenses 122, thermal energy is continuously applied. If the contact area between the micro-lenses and the protection layer is large, that is, the radius of curvature is large, some micro-lenses may be stuck to an adjacent micro-lens, while other micro-lenses may not be stuck to an adjacent micro-lens. The thickness of the photoresist in the overlapped portions of the micro-lenses stuck to each other may be different. A diffused reflection is caused by excessive overlapping of micro-lenses. Therefore, in the respective micro-lenses, a difference in sensitivity occurs due to a difference in transmitted light intensity, and uniformity in sensitivity is reduced. Therefore, there is an imposed manufacturing limit in the maximum radius of curvature of the micro-lens in order to secure an improvement in sensitivity and a uniformity of size of the micro-lenses.

SUMMARY OF THE INVENTION

To address the above limitations, it is a first objective of the present invention to provide a solid state image sensor which can maintain uniformity of the size of the micro-lens and can secure uniformity in sensitivity by forming the radius of curvature of the micro-lens to be as large as possible.

It is a second objective of the present invention to provide a method for manufacturing a solid state image sensor which can maintain uniformity of the size of the micro-lens and can secure uniformity in sensitivity, and can form the radius of curvature of the micro-lens to be as large as possible.

Accordingly, to achieve the first objective, a solid state image sensor includes trapezoidal separated sections of the protection layer which is formed on a predetermined lower layer of a semiconductor substrate, and convex micro-lenses each having a predetermined radius of curvature that are connected to each other by filling separations between trapezoidal separated sections of a protection layer with photoresist.

A flattening layer may be further included between the predetermined lower layer formed on the semiconductor substrate and the protection layer.

A layer of color filters, each filter corresponding to a separated section of the protection layer, may be further included between the flattening layer and the protection layer.

The separations between the separated sections of the protection layer preferably have a structure such that the upper portions are wider than the lower portions.

Points of contact where the upper portions of the micro-lenses connect to each other are formed preferably around the upper portions of the separations.

The predetermined lower layer formed on the semiconductor substrate may be a photodiode, a channel region, an electric charge transmission region, a gate dielectric layer, electric charge transmission electrodes, interdielectric layers, and a shading layer.

It is preferable that the protection layer is formed of a polyimide layer of a polyacryl series of a hybrid type, and that the micro-lenses are formed of a Novolak resin.

To achieve the second objective, there is provided a method for manufacturing a solid state image sensor including the steps of (a) forming trapezoidal separated sections of a protection layer by coating polyimide on a predetermined lower layer of a semiconductor substrate and using photolithography, (b) coating photoresist onto the protection layer and forming photoresist patterns, and (c) flowing the photoresist patterns into the separations between the trapezoidal separated sections of the protection layer by applying thermal energy to the photoresist patterns, and forming the micro-lenses to be connected to each other.

Before the step of forming the protection layer, a step of forming a flattening layer on the semiconductor substrate on which a predetermined lower layer is formed may be further included.

After the step of forming the flattening layer but before the step of forming the protection layer, a step of forming a layer of color filters, in which each filter corresponds to a separated section of the protection layer, may be further included.

In step (c), the photoresist may be flowed in two steps. A first step of flowing the photoresist patterns forms micro-lenses having a first radius of curvature on the separated sections of the protection layer. In a second flowing step, by applying thermal energy, photoresist flows into the separations between the separated sections of the protection layer, thereby forming micro-lenses having a second radius of curvature greater than the first radius of curvature.

It is preferable that points of contact on the upper portions of the micro-lenses connected to each other are proximal to the upper portions of the separations.

It is preferable that the separations between the separated sections of the protection layer have a structure such that the upper portions are wider than the lower portions.

A predetermined lower layer formed on the semiconductor substrate may be a photodiode, a channel region, an electric charge transmission region, a gate dielectric layer, electric charge transmission electrodes, interdielectric layers, and a shading layer.

It is preferable that the protection layer is formed of a polyimide layer of a polyacryl series of a hybrid type, and that the micro-lenses are formed of an organic substance, i.e., a Novolak resin.

In another aspect, the present invention is directed to a solid state image sensor and method. A protection layer is formed on a lower layer of a semiconductor substrate. Partitioning grooves are formed in the protection layer, the grooves defining micro-lens positions. Convex micro-lenses are formed on the protection layer at the micro-lens positions, the micro-lenses being connected to each other at the partitioning grooves, each of the micro-lenses having a radius of curvature.

The grooves preferably are wider at a top portion than at a bottom portion. The upper surfaces of the respective micro-lenses may be coupled to each other in a region proximal to the top portion of the partitioning grooves.

The micro-lens positions are preferably trapezoidal in cross-sectional profile.

A flattening layer may be provided on the lower layer, and a color filter may be provided on the flattening layer.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF PREFERRED EMBODIMENTS

The present invention now will be described more fully with reference to the appended drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same elements, and thus their description will be omitted.

EXAMPLE 1

Figure 5:
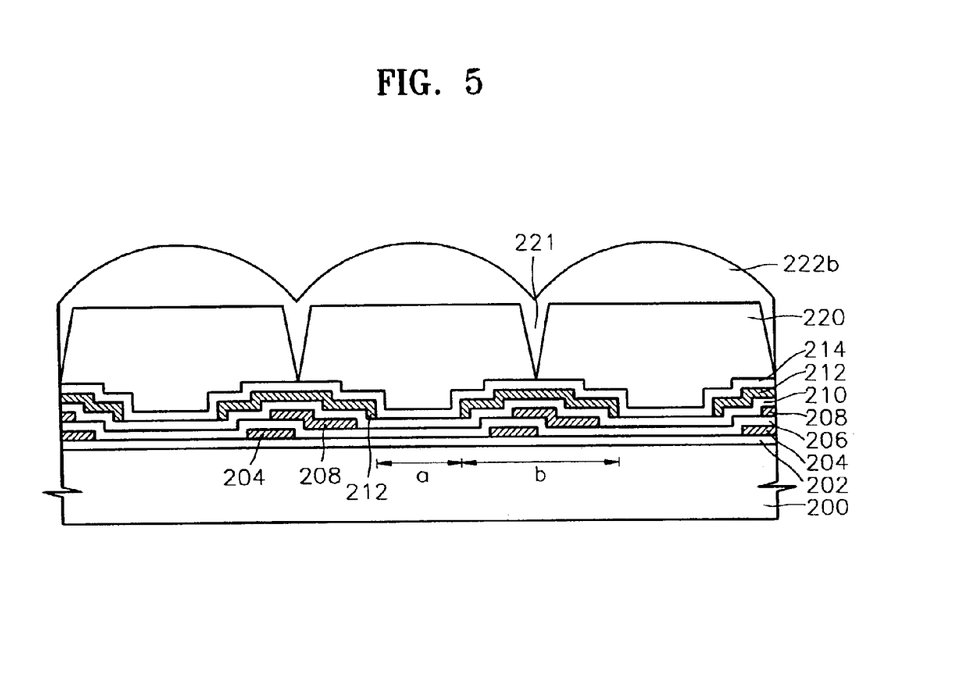

FIG. 5 is a sectional view illustrating a solid state image sensor, and in particular, a solid state image sensor having high sensitivity, according to a first preferred embodiment of the present invention.

Referring to FIG. 5, a solid state image sensor according to a first preferred embodiment of the present invention comprises trapezoidal separated sections of a protection layer 220 that is formed on a predetermined lower layer of a semiconductor substrate 200, convex micro-lenses 222b each having a greater radius of curvature than conventional micro-lenses that are connected to each other by filling separations 221, or grooves, between the separated sections of the protection layer 220 with photoresist. The separations 221 between the separated sections of the protection layer 220 are filled with photoresist to connect the micro-lenses 222b to each other.

The predetermined lower layer formed on the semiconductor substrate 200 may be, for example, a photodiode (not shown), a channel region (not shown), an electric charge transmission region (not shown), a gate dielectric layer 202, electric charge transmission electrodes 204, 208, interdielectric layers 206, 210, 214, and a shading layer 212.

In a solid state image sensor according to the first preferred embodiment, a semiconductor substrate 200 is divided into a light acceptance region (a) which receives light passing through the micro-lenses 222b and a shading region (b) which does not transmit light. A photodiode is formed on the light acceptance region (a) of the semiconductor substrate 200, and a channel region and an electric charge transmission region for transmitting charge are formed on the shading region (b) of the semiconductor substrate 200. A gate dielectric layer 202 is formed on the semiconductor substrate 200. Electric charge transmission electrodes 204, 208 that are formed on the gate dielectric layer 202 transmit electric charges provided from the photodiode. The shading layer 212 is formed of a material which does not transmit light, for example, a metallic material, and is formed all over the shading region (b). The protection layer 220 provides for a flat surface above underlying uneven upper portions of devices formed on the shading region (b) (for example, the electric charge transmission electrodes 204, 208, the shading layer 212, etc.) and protects the electric charge transmission electrodes 204, 208 and the shading layer 212. Separations 221 have a structure such that the upper portions are wider than the lower portions, for example a tapered structure as shown. The protection layer 220 is formed, for example, of a polyimide layer of a polyacryl series of a hybrid type. A pad (not shown) provides an external electric signal to a solid state image sensor, or transmits an internal electric signal of the solid state image sensor to an external interface.

Micro-lenses 222b are formed on the protection layer 220. The micro-lenses 222b are formed, for example, of an organic substance of photoresist for forming the micro-lenses 222b, for example, a Novolak resin. Since the photoresist for forming the micro-lenses 222b is flowed on the separated sections of the protection layer 220 and the separations 221, the micro-lenses 222b are connected to each other. The micro-lenses 222b according to a preferred embodiment of the present invention are convex lenses each having a greater radius of curvature than a conventional micro-lens (122 of FIG. 1). Points of contact on the upper portions of the micro-lenses 222b connected to each other, that is, the overlapped portions of the micro-lenses, are formed around the upper portions of the separations 221 between the separated sections of the protection layers 222. Incident light is focused by the micro-lenses 222b onto the light acceptance region of the semiconductor substrate 200, that is, the photodiode (a), and subsequently is changed into an electric signal.

EXAMPLE 2

Figure 7:
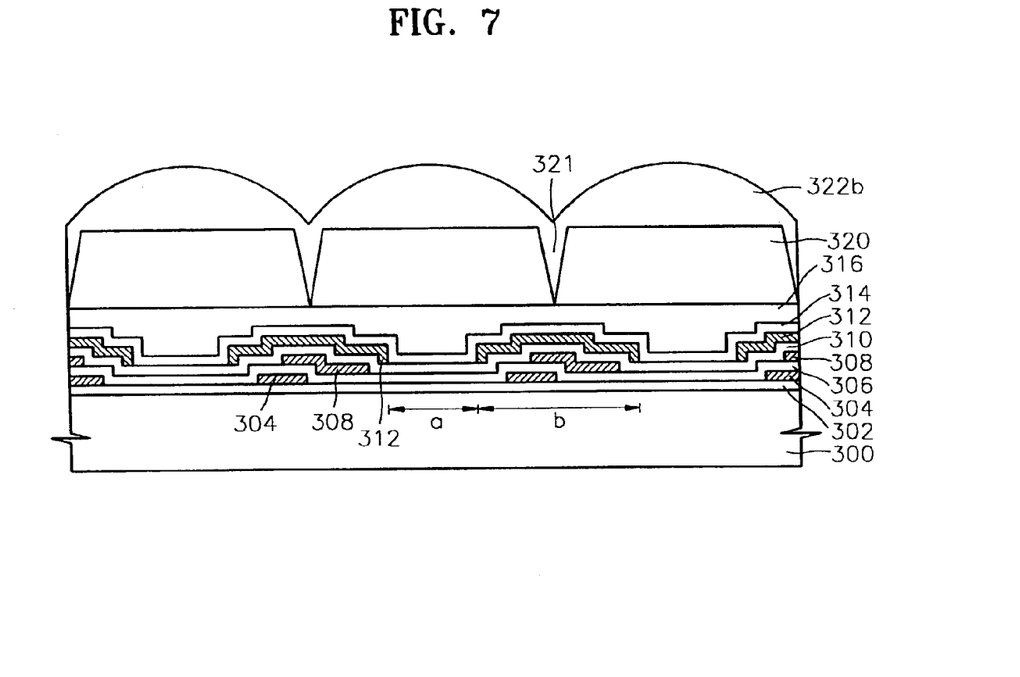

FIG. 7 is a sectional view illustrating a solid state image sensor, and in particular, a solid state image sensor having high sensitivity, according to a second embodiment of the present invention.

Referring to FIG. 7, a solid state image sensor according to a second embodiment of the present invention comprises a flattening layer 316 formed on a predetermined lower layer of a semiconductor substrate 300, trapezoidal separated sections of a protection layer 320 formed on the flattening layer 316, and convex micro-lenses 322b connected to each other by filling separations 321 between the separated sections of the protection layer 320 with photoresist and each has a greater radius of curvature than a conventional micro-lens.

The predetermined lower layer formed on the semiconductor substrate 300 may include a photodiode (not shown), a channel region (not shown), a gate dielectric layer 302, an electric charge transmission region (not shown), electric charge transmission electrodes 304, 308, interdielectric layers 306, 310, 314, and a shading layer 312.

In a solid state image sensor according to the second preferred embodiment, the semiconductor substrate 300 is divided into a light acceptance region (a) which accepts light passing through the micro-lenses 322b and a shading region (b) which does not accept light. A photodiode is formed on the light acceptance region (a) of the semiconductor substrate 300, and a channel region and an electric charge transmission region for transmitting charge are formed on the shading region (b) of the semiconductor substrate 300. The gate dielectric layer 302 is formed on the semiconductor substrate 300. The electric charge transmission electrodes 304, 308 that are formed on the gate dielectric layer 302 transmit electric charges provided from the photodiode. The shading layer 312 is formed of a material which does not transmit light, for example, a metallic material, and is formed all over the shading region (b). The flattening layer 316 is formed to flatten underlying uneven portions made by devices formed on the shading region (b) (for example, the electric charge transmission electrodes 304, 308, the shading layer 312, etc.) and to protect the electric charge transmission electrodes 304, 308 and the shading layer 312. The flattening layer 316 is preferably formed of a polyimide layer of a polyacryl series of a hybrid type. The separated sections of the protection layer 320 are formed in the shape of trapezoids on the flattening layer 316. The separations 321 have a tapered structure such that the upper portions are wider than the lower portions. The protection layer 320 is preferably formed of a polyimide layer of a polyacryl series of a hybrid type. A pad provides an external electric signal to a solid state image sensor, or transmits an internal electric signal of a solid state image sensor to an external interface.

The micro-lenses 322b are formed on the protection layer 320. The micro-lenses 322b are formed of an organic substance of photoresist for forming the micro-lenses 222b, for example, a Novolak resin. Since the photoresist for forming the micro-lenses 322b is flowed on the separated sections of the protection layer 320 and the separations 321, the micro-lenses 322b are connected to each other. The micro-lenses 322b according to the second preferred embodiment of the present invention are convex lenses each having a greater radius of curvature than a conventional micro-lens (122 of FIG. 1). Points of contact on the upper portions of the micro-lenses 322b connected to each other, that is, the overlapped portions of the micro-lenses, are formed around the upper portions of the separations 321 between the separated sections of the protection layer 322. Incident light is focused by the micro-lenses 322b onto the light acceptance portion of the semiconductor substrate 300, that is, the photodiode (a), and subsequently is changed into an electric signal.

EXAMPLE 3

Figure 9:
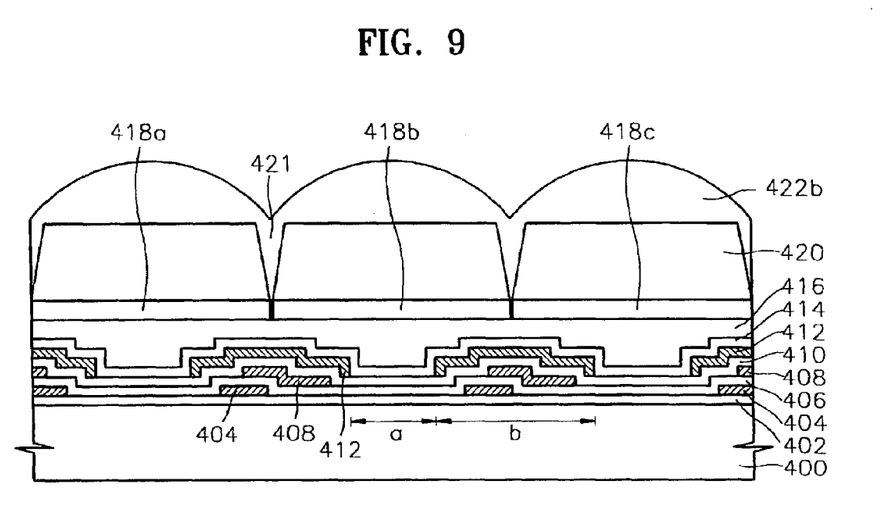

FIG. 9 is a sectional view illustrating a solid state image sensor according to a third preferred embodiment of the present invention.

Referring to FIG. 9, according to a third preferred embodiment of the present invention, a solid state image sensor comprises a flattening layer 416 formed on a predetermined lower layer of a semiconductor substrate 400, layers of color filters 418 formed on the flattening layer 416, trapezoidal separated sections of a protection layer 420 that are formed on the layers of color filters 418, and convex micro-lenses 422b connected to each other by filling the separations 421 between the separated sections of the protection layer 420 with photoresist, each micro-lens having a greater radius of curvature than a conventional micro-lens. The structure of example 3 is the same as that of example 2, except that the layer of color filters 418 corresponding to the separated sections of the protection layer 420 is further included between the flattening layer 416 and the protection layer 420.

Hereinafter, a method for manufacturing a solid state image sensor according to a preferred embodiment of the present invention will be described.

EXAMPLE 1

FIGS. 2 through 5 are sectional views illustrating a method for manufacturing a solid state image sensor, and in particular, a solid state image sensor having high sensitivity, according to a first preferred embodiment of the present invention.

Figure 2:
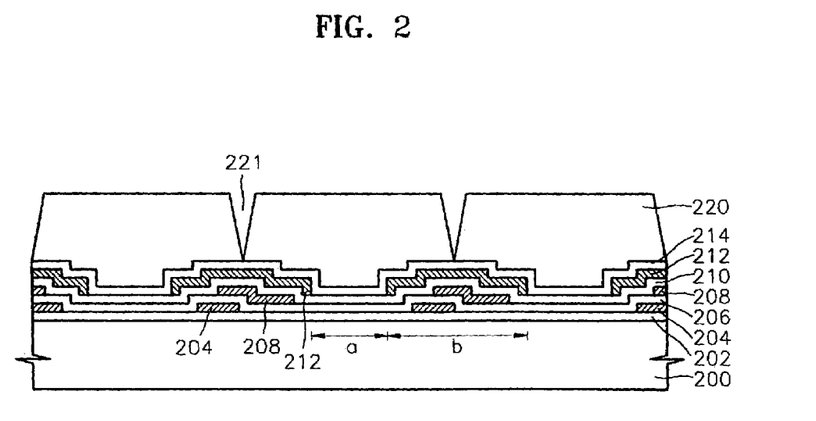
FIGS. 2 through 5 are sectional views illustrating a method for manufacturing a solid state image sensor according to a first preferred embodiment of the present invention.

Referring to FIG. 2, after a photodiode (not shown), a channel region (not shown), and an electric charge transmission region (not shown) are formed on a semiconductor substrate 200, a gate dielectric layer 202 is formed. A first electric charge transmission electrode 204 is formed on the electric charge transmission region, and a first interdielectric layer 206 for insulating the first electric charge transmission electrode 204 from other devices is formed on the first electric charge transmission electrode 204 and the gate dielectric layer 202. A second electric charge transmission electrode 208 is formed on the first interdielectric layer 206, and a second interdielectric layer 210 for insulating the second electric charge transmission electrode 208 from other devices is formed on the second electric charge transmission electrode 208 and the first interdielectric layer 206. The electric charge transmission electrodes 204, 208 are preferably formed of polysilicon. The gate dielectric layer 202, the first interdielectric layer 206, and the second interdielectric layer 210 are preferably formed of a silicon oxide layer. In FIG. 2, only two electric charge transmission electrodes 204, 208 are shown; however, more than two electric charge transmission electrodes may be formed. A shading layer 212 is formed on the second interdielectric layer 210 over the electric charge transmission electrodes 204, 208. The shading layer 212 is preferably formed of a metallic material which light cannot penetrate, for example, Al doped with 0.1% by weight of Si. Next, a third interdielectric layer 214 for insulating the shading layer 212 from other devices is formed. The third interdielectric layer 214 is preferably formed of a silicon nitride layer. Next, after a pad (not shown) is formed, a polyimide of a polyacryl series of a hybrid type is coated on the resultant structure. The polyimide is preferably coated to, for example, a thickness of 3 μm~5 μm. Next, the polyimide layer is flattened, and then trapezoidal separated sections of a protection layer 220 are formed using photolithography. Separations 221 between the separated sections of the protection layer 220 are preferably formed to have a tapered structure such that the upper portions are wider than the lower portions. Other structures are equally applicable, for example stepped structures (not shown). Next, the protection layer 220 on an upper portion of a pad is removed to expose the pad.

Figure 3:
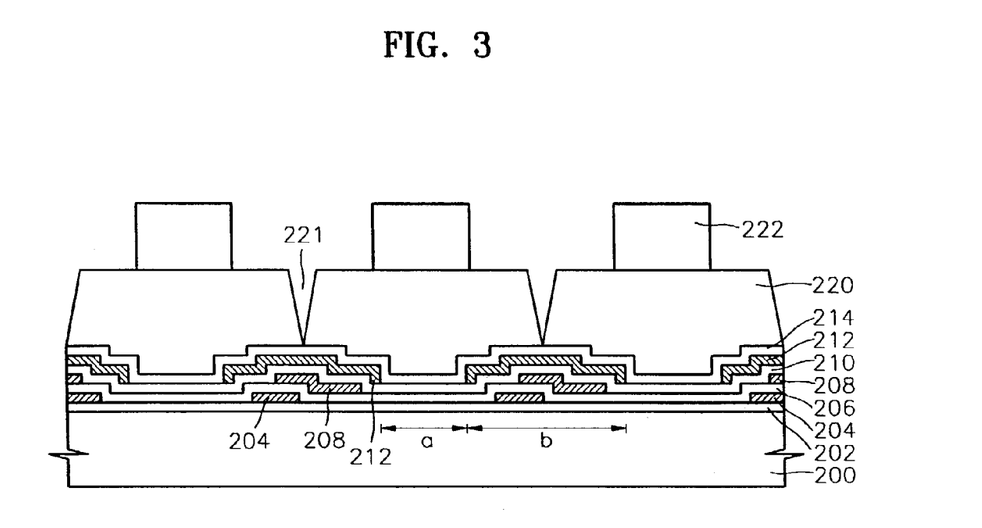

Referring to FIG. 3, photoresist for forming a micro-lens, for example a Novolak resin, is coated on the protection layer 220 and then patterned, thereby forming photoresist patterns 222 for forming micro-lenses.

Figure 4:
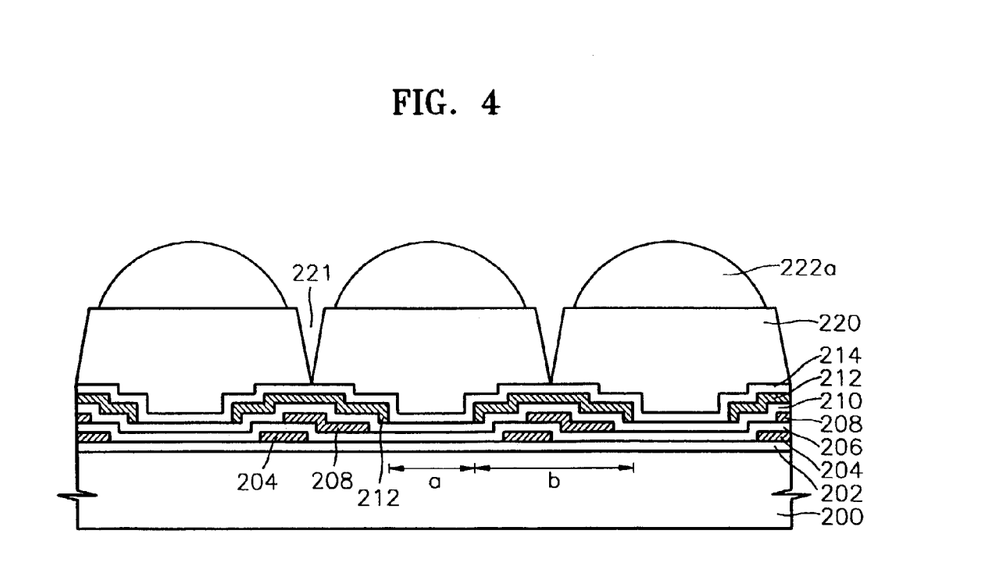

Referring to FIGS. 4 and 5, the micro-lenses 222b that are connected to each other are formed such that the separations 221 between the separated sections of the protection layer 220 are filled with a photoresist. Thermal energy is applied to the photoresist patterns 222 to cause the photoresist to flow into the separations 221. In this case, the micro-lenses 222b as shown in FIG. 5 may be formed by flowing the photoresist patterns 222 once, but it may also be formed by a first and a second flow step as follows. That is, applying thermal energy to the photoresist patterns 222 allows the photoresist to flow and form micro-lenses 222a shown in FIG. 4 with a predetermined radius of curvature. A second application of thermal energy causes the photoresist to flow a second time, this time filling the separations 221 between the separated protection layers 220, and thereby resulting in micro-lenses 222b shown in FIG. 5 having a greater radius of curvature than the micro-lens 222a of FIG. 4 following the first flow. Preferably, the flow of the photoresist patterns 222 is controlled to position the points of contact on the upper portions between the micro-lens 222b and the adjacent micro-lens 222b at a predetermined location, for example proximal to the upper portions of the separations 221.

EXAMPLE 2

Figure 6:
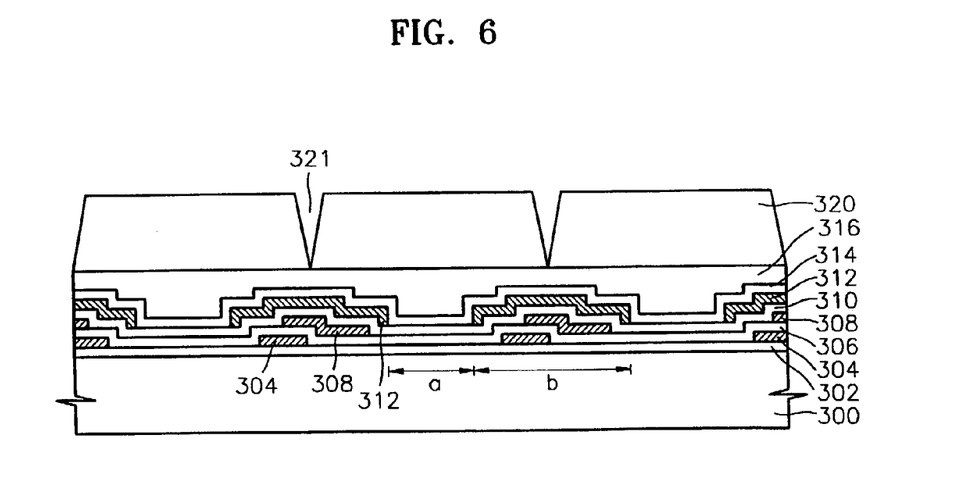
FIGS. 6 and 7 are sectional views illustrating a method for manufacturing a solid state image sensor according to a second preferred embodiment of the present invention.

FIGS. 6 and 7 are sectional views illustrating a method for manufacturing a solid state image sensor, and in particular, a solid state image sensor having high sensitivity, according to a second preferred embodiment of the present invention.

Referring to FIG. 6, the processes for forming a photodiode (not shown), a channel region (not shown), an electric charge transmission region (not shown), a gate dielectric layer 302, a first electric charge transmission electrode 304, a first interdielectric layer 306, a second electric charge transmission electrode 308, a second interdielectric layer 310, a shading layer 312, and a third interdielectric layer 314 are the same as in example 1. In FIG. 6, only two electric charge transmission electrodes 304, 308 are shown; however, more than two electric charge transmission electrodes may be formed. Next, after a pad (not shown) is formed, a flattening layer 316 is formed for providing an upper flat surface above the underlying uneven portions made by devices formed on the semiconductor substrate 300 (for example, the electric charge transmission electrodes 304, 308, the shading layer 312, etc.). The flattening layer 316 is preferably formed of a polyimide of a polyacryl series of a hybrid type. The polyimide is coated on the surface of the flattening layer 316 to, for example, a thickness of 3 μm~5 μm. Next, the polyimide layer is flattened, and then separated sections of a protection layer 320 are formed, for example, in the shape of trapezoids using photolithography. Separations 321 between the separated sections of the protection layer 320 are preferably formed to have a tapered structure such that the upper portions are wider than the lower portions. The protection layer 320 is preferably formed of a polyimide of a polyacryl series of a hybrid type. Next, removing the protection layer 320 and the flattening layer 316 on the upper portion of a pad exposes the pad.

Referring to FIG. 7, a process for forming photoresist pattern on the separated sections of the protection layer 320, a process flowing the photoresist patterns 222 of FIG. 3 in order to form the micro-lenses 322b by applying thermal energy to the photoresist patterns 222 of FIG. 3, and a process for forming micro-lenses 322b, and a process for forming micro-lenses 322b are the same as in example 1.

EXAMPLE 3

Figure 8:
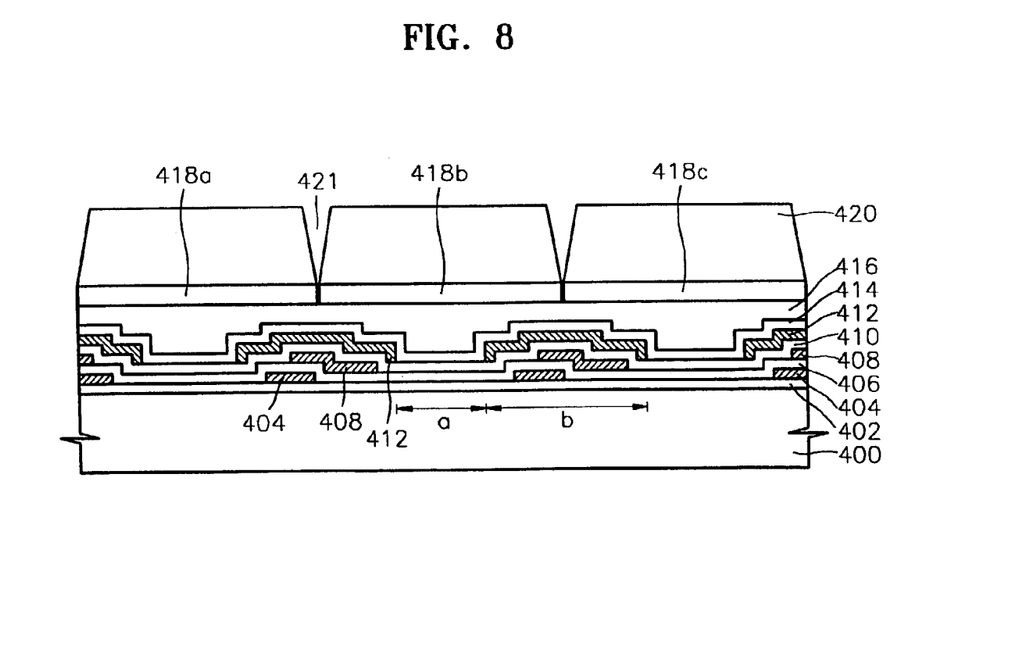
FIGS. 8 and 9 are sectional views illustrating a method for manufacturing a solid state image sensor according to a third preferred embodiment of the present invention.

FIGS. 8 and 9 are sectional views illustrating a method for manufacturing a solid state image sensor according to a third preferred embodiment of the present invention.

Referring to FIG. 8, the process for forming a photodiode (not shown), a channel region (not shown), an electric charge transmission region (not shown), a gate dielectric layer 402, electric charge transmission electrodes 404, 408, interdielectric layers 406, 410, 414, a shading layer 412, a pad (not shown) and a flattening layer 416 on the semiconductor substrate are the same as in example 2. Next, a photoresist is coated on the flattening layer 416, patterned, and dyed with a first pigment, thereby forming a first color filter 418a. Then, after the photoresist is coated again, patterned, and dyed with a second pigment, a second color filter 418b is formed. A third color filter 418c and a fourth color filter (not shown) and as many color filters as necessary, may be manufactured by repeating these steps. A polyimide is coated on the entire surface of the layer of color filters 418 with, for example, a thickness of 3 μm~5 μm. Next, the polyimide layer is flattened, and then separated sections of a protection layer 420 are formed, for example in the shape of trapezoids, using photolithography. The separations 421 between the separated sections of the protection layer 420 are preferably formed to have a tapered, or stepped, structure such that the upper portions are wider than the lower portions. The protection layer 420 is preferably formed of a polyimide of a polyacryl series of a hybrid type. Next, removing the protection layer 420 and the flattening layer 316 on the upper portion of a pad exposes the pad.

Referring to FIG. 9, a process for forming the photoresist pattern on the separated sections of the protection layer 420, a process for flowing the photoresist patterns 222 of FIG. 3 in order to form the micro-lenses 422b by applying thermal energy, and a process for forming the micro-lenses 422b are the same as in example 1.

According to a solid state image sensor and a manufacturing method thereof of the present invention, the separations between the separated sections of the protection layer are filled with a micro-lens constituent, that is, a photoresist, in order to secure a size uniformity and a large radius of curvature of the micro-lenses, so that the size uniformity of the micro-lenses is secured and also the light sensitivity of the micro-lenses can be improved and the sensitivity uniformity can be obtained. That is, the separations between the separated sections of the protection layer are filled with photoresist to connect adjacent micro-lenses in order to reduce diffused reflection, thereby increasing incident light intensity.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a solid state image sensor comprising:
   (a) forming trapezoidal separated sections of a protection layer by coating a polyimide on a lower layer of a semiconductor substrate and forming separations between the separated sections using photolithography, such that lower portions of adjacent separated sections are proximal to each other, wherein a width of each separation between the separated sections is substantially less than a width of the separated sections;
   (b) coating the protection layer with photoresist and patterning the photoresist to form a plurality of photoresist patterns, each photoresist pattern formed on a top portion of a corresponding trapezoidal separated section; and
   (c) flowing the photoresist patterns into the separations between the trapezoidal separated sections of the underlying protection layer by applying thermal energy to the photoresist patterns, resulting in micro-lenses that are connected to each other.

2. The method of claim 1, further comprising forming a flattening layer on the semiconductor substrate before forming the protection layer.

3. The method of claim 2, further comprising forming a layer of color filters corresponding to the separated sections of the protection layer after forming the flattening layer, and before forming the protection layer.

4. The method of claim 1, wherein flowing the photoresist patterns comprises:
   first flowing the photoresist patterns to form micro-lenses, each having a first radius of curvature on the separated sections of the protection layer; and
   second flowing the micro-lenses by applying thermal energy to cause photoresist to flow into the separations, and forming the micro-lenses having a second radius of curvature greater than the first radius of curvature.

5. The method of claim 1, wherein points of contact on upper portions of the micro-lenses connected to each other are proximal to upper portions of the separations.

6. The method of claim 1, wherein the separations between the separated sections of the protection layer are formed to have a structure such that upper portions thereof are wider than lower portions thereof.

7. The method of claim 1, wherein the lower layer formed on the semiconductor layer includes a photodiode, a channel region, an electric charge transmission region, a gate dielectric layer, electric charge transmission electrodes, interdielectric layers, and a shading layer.

8. The method of claim 1, wherein the protection layer is formed of a polyimide layer of a polyacryl series of a hybrid type, and the micro-lenses are formed of an organic Novolak resin.

9. The method of claim 1 wherein the lower portions of adjacent trapezoidal separated sections are connected to each other.

10. A method for forming a solid state image sensor comprising:
    forming a protection layer on a lower layer of a semiconductor substrate;
    forming partitioning grooves in the protection layer, the grooves partitioning the protection layer into a plurality of sections, lower portions of adjacent sections being proximal to each other, wherein a width of each groove between the sections is substantially less than a width of the sections, the plurality of sections in turn defining micro-lens positions; and
    forming a plurality of patterns of lens material on the protection layer, each at a corresponding micro-lens position, and flowing the lens material patterns into the partitioning grooves of the underlying protection layer to form micro-lenses that are connected to each other at the partitioning grooves, each of the micro-lenses having a radius of curvature.

11. The method of claim 10 wherein the grooves are wider at a top portion than at a bottom portion.

12. The method of claim 11 wherein upper surfaces of the respective micro-lenses are coupled to each other in a region proximal to the top portion of the partitioning grooves.

13. The method of claim 10 wherein the sections are trapezoidal in profile.

14. The method of claim 10 further comprising forming a flattening layer on the lower layer.

15. The method of claim 14 further comprising providing a color filter on the flattening layer.

16. The method of claim 10, wherein the lower portions of adjacent trapezoidal separated sections are connected to each other.

17. A method for manufacturing a solid state image sensor comprising:
    forming trapezoidal separated sections of a protection layer by coating a polyimide on a lower layer of a semiconductor substrate and forming separations between the separated sections using photolithography, such that lower portions of adjacent separated sections are proximal to each other;
    coating the protection layer with photoresist and patterning the photoresist to form photoresist patterns on top portions of the trapezoidal separated sections;
    applying a first application of thermal energy to the photoresist patterns to form micro-lenses, each micro-lens having a first radius of curvature; and
    flowing the photoresist patterns into the separations between the trapezoidal separated sections of the underlying protection layer by applying a second application of thermal energy to the photoresist patterns, resulting in micro-lenses each having a second radius of curvature that are connected to each other, wherein the second radius of curvature is greater than the first radius of curvature.

* * * * *